United States Patent [19]
Schmitt et al.

[11] Patent Number: 5,793,610
[45] Date of Patent: Aug. 11, 1998

[54] MULTI-POSITION AIR REGULATION DEVICE

[75] Inventors: Ty Schmitt, Round Rock; David Lyle Moss, Austin, both of Tex.

[73] Assignee: Dell USA, L.P., Round Rock, Tex.

[21] Appl. No.: 963,305

[22] Filed: Nov. 3, 1997

Related U.S. Application Data

[63] Continuation of Ser. No. 591,068, Jan. 25, 1926, abandoned.
[51] Int. Cl.$^6$ .................................................. H05K 7/20
[52] U.S. Cl. ......................... 361/695; 165/80.3; 361/687; 454/353
[58] Field of Search .................. 364/708.1; 200/81.9 R; 236/16; 165/80.3, 101, 137, 121–126; 454/184, 353; 16/225, 227, 254, 260, 261, 268, 270, 360, 380, 383; 361/687, 690, 692–695

[56] References Cited

U.S. PATENT DOCUMENTS

| | | | |
|---|---|---|---|
| 1,532,635 | 4/1925 | Osbun | 16/360 |
| 4,648,007 | 3/1987 | Garner | 361/384 |
| 4,872,398 | 10/1989 | Shen | 98/42.08 |
| 4,919,327 | 4/1990 | Elluin | 236/49.1 |
| 5,101,320 | 3/1992 | Bhargava | 361/694 |
| 5,208,730 | 5/1993 | Tracy | 361/384 |
| 5,210,680 | 5/1993 | Scheibler | 361/695 |
| 5,493,473 | 2/1996 | Yanagi | 361/695 |

*Primary Examiner*—Gerald P. Tolin
*Attorney, Agent, or Firm*—Skjerven, Morrill, MacPherson, Franklin & Friel, L.L.P.; Stephen A. Terrile

[57] ABSTRACT

The present invention provides a cooling fan system for a chassis configured to contain heat generating electrical components and to assume horizontal and vertical alternative operating orientations. The cooling fan system includes a support member securable within the chassis and having an air flow opening formed therein. Additionally, the cooling fan system includes a louver member hingedly attached to the support member to rotate between an open position wherein a substantial air flow is allowed through the air flow opening and a closed position wherein the louver member covers the air flow opening. The louver member may be made from plastic, however, other types of rigid materials that can withstanding the chassis' operating conditions could also be used, such as metal. The axis of rotation of the louver member is oriented with respect to the chassis to allow gravity to urge the louver member toward the closed position when the chassis is positioned in either the horizontal or vertical alternative operating orientations, to thereby prevent a back-flow of air in the chassis.

24 Claims, 3 Drawing Sheets

MULTI-POSITION AIR REGULATION DEVICE

This application is a continuation of application Ser. No. 08/591,068, filed Jan. 25, 1996, now abandoned.

TECHNICAL FIELD OF THE INVENTION

The present invention is directed, in general, to a cooling system for a chassis containing a heat generating electrical component therein and, more specifically, to a multi-position air regulation device used to cool a heat generating electronic component within a computer system.

BACKGROUND OF THE INVENTION

As computer systems grow in speed and shrink in size, power consumed within the computer per unit volume (power density) increases dramatically. Thus, it becomes evermore important to dissipate the heat generated by components within the computer during operation to ensure that the components remain within their normal operating temperature ranges. This reduces the chance that the components will fail immediately or have too short a lifetime.

In early desktop personal computers, components were passively cooled by radiation or convection, the surfaces of the components themselves interfacing directly with still air surrounding the component to transfer heat thereto. Unfortunately, air is not a particularly good conductor of heat. Therefore, in the early desktop computers, the heated air tended to become trapped, clinging to the components, acting as a thermal insulator and increasing component operating temperature. Eventually, computers were provided with fans to force air over the surfaces of the components, decreasing the temperature differential between the surface of the component and the surrounding air to increase the efficiency of heat transfer. The decreased temperature differential overcame some of the poor heat-conducting qualities of air.

There are two processes by which the heat in computer systems can be dissipated to ensure that the components remain within their normal operating temperature ranges. First, heated air within a chassis of the computer system may be replaced with cool air outside the chassis of the computer system. This is typically known as an air exchange cooling process. Second, a specific component may be cooled by directly applying air across the surface of the component. High velocity air immediately applied to the surface of the component raises the convective heat transfer coefficient for the surface of that component, thereby increasing convection cooling with respect to that component. This process is typically known as force-cooling. The computer system may incorporate either process, or a combination thereof, to ensure that the components remain within their normal operating temperature ranges.

Ever increasing operation temperatures have become an even more prevalent problem with the advent of large multi-tasking servers. Because of the demands placed on them, today's servers have redundant features such as power supplies, hard drives and cooling systems. If one system fails, another system can continue the function of the failed system to help decrease potential downtime. Because of the vast number of heat generating components within such systems, it is critical that redundant cooling systems also be present. Such redundant cooling systems typically comprise a bank of fans in series. If one fan stops, the fan in series with it continues to operate, thus cooling the system. However, this solution does not lend itself very well to systems that have extreme size or cost limitations. Due to the space constraints in these smaller servers, generally only one row of fans in parallel is used to provide redundancy in the case of fan failure. The extreme operating temperatures of the server require a continual and proper air circulation within the server to effectuate the required amount of cooling. If the operation temperature becomes too high, electrical components can over heat, thereby causing premature failure of the component or a shortening of the component's useful life.

While redundant fans are useful in continually cooling the electrical components when one of the fans fails, operating temperature within the server chassis may still rise when such a fan failure transpires. The reason for this temperature increase is that in some servers a back-flow of air occurs. Generally, the air is pulled into the server chassis by the redundant fans, which in this embodiment are placed in an intermediate position within the chassis. As the air is pulled into the chassis, the air passes by the heat generating electrical components, which causes a heat transfer from the components to the surrounding air flow. The air then enters the fan shroud and is forced outwardly through the remaining portion of the chassis across yet another series of heat generating electrical components. When a fan in parallel with other fans fails, a significant amount of the air moved through the remaining operating fans recirculates back through the failed fan. This recirculation creates a back-flow pressure on the air intake side within the server chassis, which prevents the remaining operating fans from pulling a sufficient amount of cooler outside air into the chassis. The fans' failure to pull a sufficient amount of cooler air into the chassis, in turn, causes a build-up of heat on the electrical components.

To circumvent this problem, fan shrouds each having a louver associated therewith (hereinafter referred to as a "valve") are used in conventional systems. The valve on each fan is rotationally forced by the air flow to an open position during normal operation. However, when a fan fails, the cessation of the air flow allows the valve associated with that fan to rotate to a closed position under the force of gravity, thereby preventing a back-flow of air through the failed fan and into the air intake portion of the chassis. While these valves do function to reduce the amount of back-flow through the failed fan, they suffer from the disadvantage that they are typically hinged to the fan shroud based on whether the unit will rest in the horizontal or vertical position during normal operation. Because conventional valve designs are dependent on the force of gravity, the orientation of the chassis is critical to the valve's proper functioning. Thus, conventional valves will not operate properly when placed in an orientation different from the orientation for which they were designed. For example, if the valve is designed to rotate to a closed position within a chassis having a horizontal position during normal operation, the valve will not function properly if the unit is placed in a vertical position on its side edge. This limitation thus requires a different valve structure for each chassis that is designed to have a different operational orientation. Such limitations not only increase manufacturing costs but also restrict the use of the chassis unit by limiting the operational position of the unit.

Accordingly, there is a need in the art for a chassis having a fan-valve that prevents back-flow but yet whose operation is not dependent on the chassis' orientation. The present invention provides a chassis and fan-valve that addresses these needs.

SUMMARY OF THE INVENTION

To address the above-discussed deficiencies of the prior art, the present invention provides a cooling fan system for a chassis configured to contain heat generating electrical components and to assume a horizontal and vertical alternative operating orientations. In a preferred embodiment, the cooling fan system comprises a support member securable within the chassis that has an air flow opening formed therein. Additionally, the cooling fan system comprises a louver member hingedly attached to the support member to rotate between an open position wherein a substantial air flow is allowed through the air flow opening and a closed position wherein the louver member covers the air flow opening. Preferably, the louver member is comprised of plastic, however, other types of rigid materials that can withstanding the chassis— operating conditions could also be used, such as metal. The axis of rotation of the louver member is oriented with respect to the chassis to allow gravity to urge the louver member toward the closed position when the chassis is positioned in either the horizontal or vertical alternative operating orientations, to thereby prevent a back-flow of air in the chassis.

This configuration provides the distinct advantage of allowing the chassis to be placed in either a horizontal operating position or a vertical operating position without the chosen orientation affecting the operability of the louver members hinged to the support member.

In a preferred embodiment, the louver is comprised of a plurality of louvers hingedly attached to the support member. The plurality of louvers are designed to partially overlap to collectively cover the air flow opening. More preferably, however, the plurality of louvers is comprised of three louvers. This particular embodiment has the advantage of being operable in a chassis where the various electrical components are spaced closely together. When used in such applications, the plurality of louvers have a width that is less than the distance between the support member and the electrical components. This allows the louvers to pivot to an open position without being obstructed by the electrical components. This advantage is particularly desirable when the present invention is used in computer-server applications where space is at a premium because compactness is highly desirable.

In yet another aspect of the present invention, the cooling fan further comprises a cooling fan supported within a fan shroud and positioned over the air flow opening, to thereby force a flow of air through the air flow opening when the louver member is in the open position.

In a more preferred embodiment of the present invention, the support member has a plurality of air flow openings formed therein and a plurality of the louver members associated therewith. This arrangement can provide a large amount of air flow in those instances where such an air flow is required. In another aspect of this particular embodiment, the cooling fan system further comprises a plurality of cooling fans with each of the plurality of cooling fans positioned over one of the plurality of the air flow openings. This is representative of the redundant systems that are frequently used in server units. In such instances, where one fan fails, the remaining fans are designed to provide an air flow sufficient to cool the electrical components in the chassis. The louvers associated with the failed fan pivot to the closed position on the occurrence of such a failure, regardless of whether the chassis is in a horizontal or vertical operating position to prevent back-flow of air. In yet another aspect of this particular embodiment, the plurality of air flow openings are preferably formed in parallel across a length of the support members.

In a preferred embodiment, the axis of rotation is at a 45° angle with respect to the chassis in both of the horizontal and vertical alternative operating orientations. It should be understood, however, that various angles could be used for the axis of rotation provided that they allow the louver member to pivot to a closed position when the chassis is in either the horizontal or vertical operating orientations.

In yet another aspect of the present invention, the support member has opposing hinge supports mounted adjacent to the air flow opening and coaxial with the axis of rotation. The louver member includes hinge members that project from opposite side edges of the louver member. Preferably, the hinge members are comprised of opposing snap members wherein the snap members have a generally flexible, bifurcated insertion end portion configured to be received through openings formed in the hinge supports. Preferably, the insertion end has a shape similar to that of an arrow that has been bifurcated down the middle. This configuration allows the louver members to be easily replaced if necessary.

In another aspect of the present invention, there is provided a computer, preferably a server, comprising a chassis configured to contain heat generating electrical components and to assume a horizontal and vertical alternative operating orientations. The computer further comprises a cooling fan system that includes a support member securable within the chassis and having an air flow opening formed therein and a louver member hingedly attached to the support member to rotate between an open position wherein a substantial air flow is allowed through the air flow opening and a closed position wherein the louver member covers the air flow opening, an axis of rotation of the louver member oriented with respect to the chassis to allow gravity to urge the louver member toward the closed position when the chassis is positioned in either the horizontal or vertical alternative operating orientations.

This particular embodiment offers the same advantages as those mentioned above for any chassis. The difference is that the present invention also has application to computers in general, and servers in particular, where redundant systems are frequently used.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
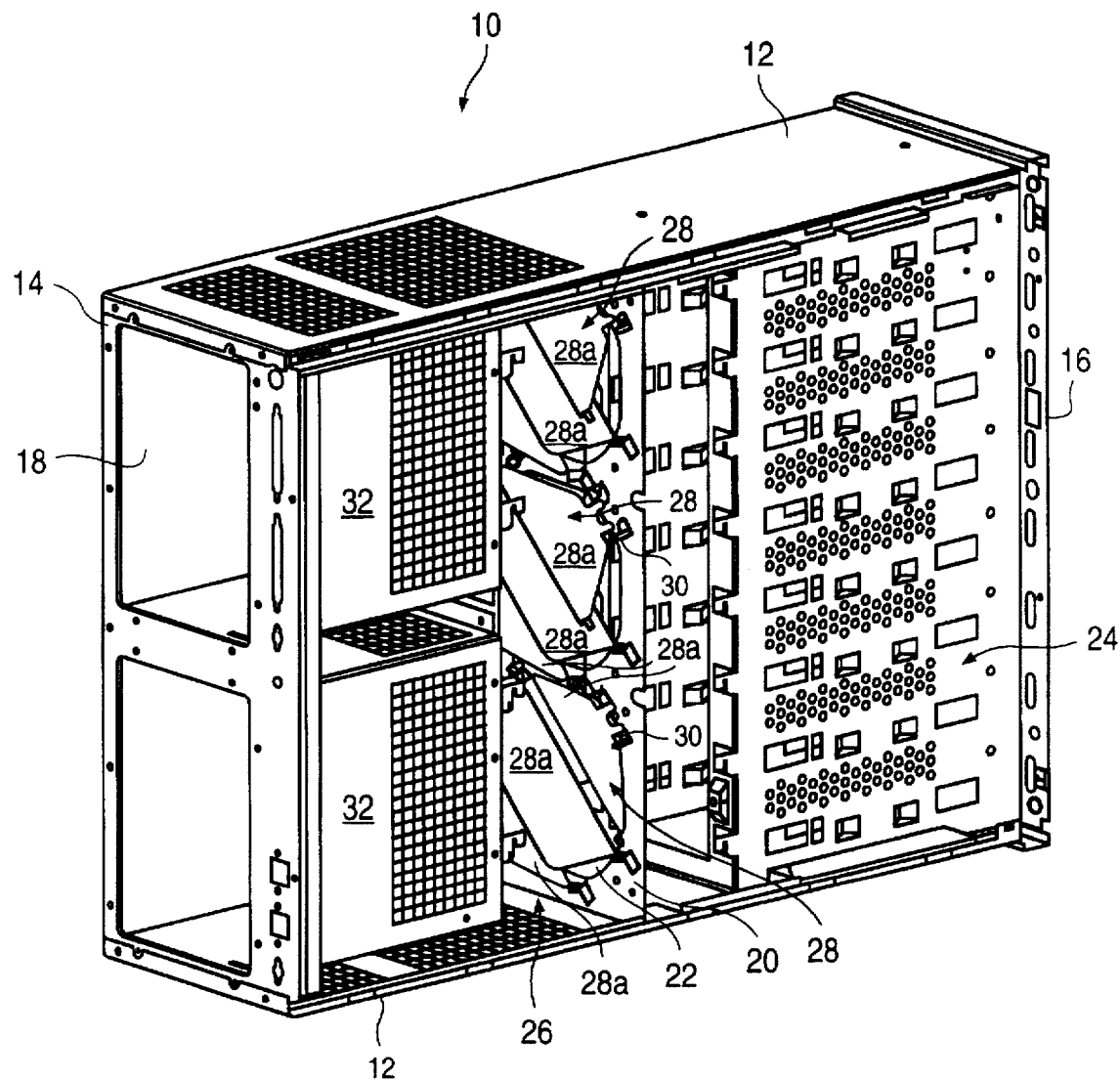
FIG. 1 illustrates a perspective interior view of a conventional chassis configured to contain heat generating electrical components therein and having a support member with air flow openings and louver members associated therewith positioned in the chassis.

Referring initially to FIG. 1, there is illustrated, in a preferred embodiment thereof, a chassis 10 configured to contain heat generating electrical components (not shown) therein and positioned in a vertical operating position. Preferably, the chassis 10 is a computer chassis, such as a server, that is configured to contain redundant electrical components therein and that has a generally rectangular shape with opposite side edge walls 12, a front end wall 14, a rear end wall 16 and a bottom support wall 18 that allow the chassis 10 to be placed in either a horizontal or vertical operating position as defined below. A support member 20 within the chassis 10 divides the chassis 10 into a first section 24 in which heat generating electrical components are typically housed, and a second section 26 in which power supplies are most often housed in power supply cages 32. The support member 20 has an air flow opening 22 formed therein to allow the air to flow either from the first section 24 to the second section 26 or from the second section 26 to the first section 24. In a preferred embodiment, the support member 20 has a plurality of air flow openings 22 formed therein. Each air flow opening 22 has a louver member 28, which in a preferred embodiment, is a plurality of louver members 28a that are configured to overlap and cover the air flow openings 22, attached thereto by a hinge member 30. In many instances, it is desirable that the louver members 28 have a smaller width such that they can pivot fully to the open position without being obstructed by power supply cages 32. This smaller width is particularly desirable in those instances where the interior of the chassis 10 is congested due to the close proximity of the electrical components and power supplies. The louver members 28a have an angle of rotation oriented with respect to the chassis 10 to allow gravity to urge the louver members 28 toward a closed position when the chassis 10 is positioned in either the horizontal or vertical alternative operating orientations. As used herein, the phrase "horizontal or vertical operating orientations" broadly means those operating positions of the chassis 10 wherein the axis of rotation of the louver member 28 intersects both a horizontal and a vertical plain of the chassis 10. Alternatively and in a narrower sense an operating position includes those positions where the chassis 10 is standing on a side edge 12, such as in a tower unit, or lying on a bottom side 18, such as in a desktop unit, and does not include those positions that would require standing the chassis 10 on its rear side edge 16 or on its front side edge 14. As is well known, these two latter positions would not be desirable operating positions because the I/O interface, which is connected to electrical cables, could be broken if the chassis 10 were placed on its rear side edge 16 and access to the power supplies would be obstructed if the chassis 10 were placed on its front side edge 14. In a preferred embodiment, however, the angle of rotation is at a 45° with respect to the chassis 10 when the chassis 10 is positioned in either the horizontal or vertical operating orientation.

In typical computers systems in which the present invention is particularly applicable, an air flow is created through the chassis 10 by conventional cooling fans (not shown), such as a biscuit fan. Cooler air is pulled into the chassis 10 from the outside by the cooling fan. As the air passes by the electrical components, heat is transferred from the heat generating electrical components to the cooler air. The air is then pulled through the first section 24 and the air flow openings 22 in the support member 20 by the cooling fan and then forced through the second section 26 and the power supply cages 32, thereby cooling the power supplies.

In a redundant cooling fan system, as long as the cooling fan is operating, the flow of air generated by the cooling fan is sufficient to cause the louver members 28 to be maintained in an open position as illustrated. However, when one of the fans fails the louver members 28 associated with that cooling fan close by force of gravity and prevent a back-flow of air into the first section 24 of the chassis 10. This closing action allows the remaining operating fans to continue to pull cool air from the outside and through the chassis 10. If the louver members 28 are unable to close, the back-flow of air lessens the amount of air that is pulled in from the outside. In such instances, the temperatures within the chassis 10 can exceed normal operating temperatures, thereby causing components to fail prematurely.

Figure 2:
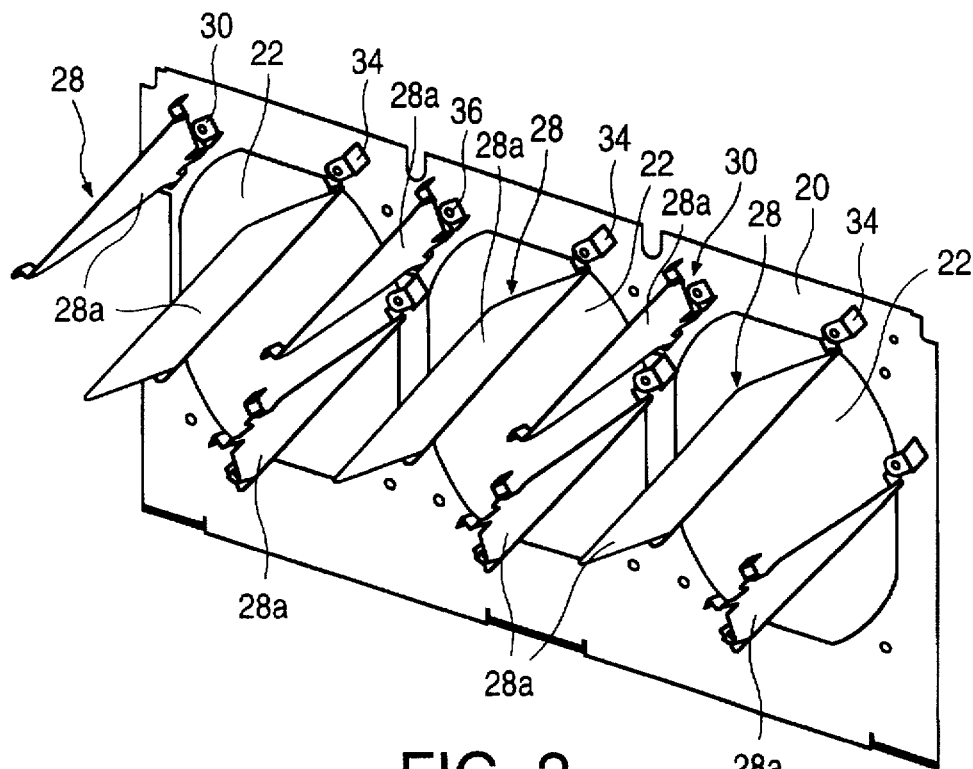
FIG. 2 illustrates a perspective view of a preferred embodiment of the support structure with air flow openings formed therein and a plurality of hinged louvers in the open position associated therewith.

Turning now to FIG. 2, there is illustrated a preferred embodiment of the support member 20 having a plurality of air flow openings 22 formed therein and having louver members 28 associated therewith that are in the open position. The support member 20 preferably has a generally elongated, flat rectangular shape with a plurality of louver members 28a associated with each air flow opening 22 that are configured to overlap and cover the air flow opening 22 when in the closed position. The support member 20 has a length sufficient to extend across a width of the chassis 10 to divide the chassis 10 into the first and second sections 24,26 (see FIG. 1). Each individual louver member 28a is preferably hinged at a 45° angle with respect to the chassis 10 and may be counter-weighted to facilitate the closing of the louver member 28a in the event of a cooling fan failure. The support member 20 includes opposing hinge supports 34 mounted adjacent the air flow openings 22 and coaxially with the axis of rotation of the louver members 28a. The hinge supports 34 preferably have openings 36 formed therein to receive hinge members 30 therethrough that allow the louver members 28a to rotate about the axis of rotation.

Figure 3:
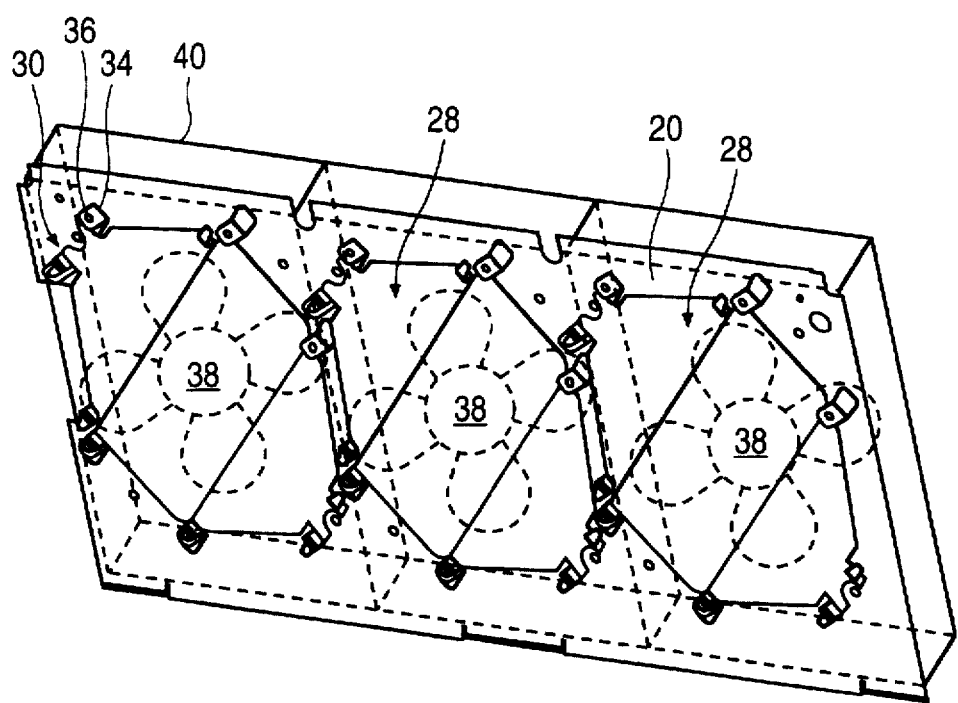
FIG. 3 illustrates a perspective view of a preferred embodiment of the support structure with a plurality of air flow openings formed therein, a plurality of hinged louvers in the closed position associated therewith and cooling fans supported in fan shrouds and covering the air flow openings.

Referring now to FIG. 3, there is illustrated the support member 20 with the louver members 28 in the closed position. Preferably, the louver members 28 are a plurality of overlapping louver members 28a that cover the air flow opening 22 when in the closed position. Additionally, the support member 20 includes a plurality of the cooling fans 38 where each cooling fan 38 is received within a fan shroud 40 and is positioned over one of the plurality of air flow openings 22. The cooling fans 38 used in conjunction with the present invention are well known in the art and are designed to collectively generate an air flow within the chassis 10 sufficient to cool the heat generating electrical components. For example, in a system having a three fan redundant system, each cooling fan 38 may be designed to move approximately 90 cfm of air per fan, thus giving a total air flow capacity of approximately 270 cfm. Preferably, the volume of air flow to be moved by each cooling fan 38 is sufficient such that if any one of the three cooling fans 38 fail, the remaining operating cooling fans 38 are sufficient to cool the electrical components.

Figure 4:
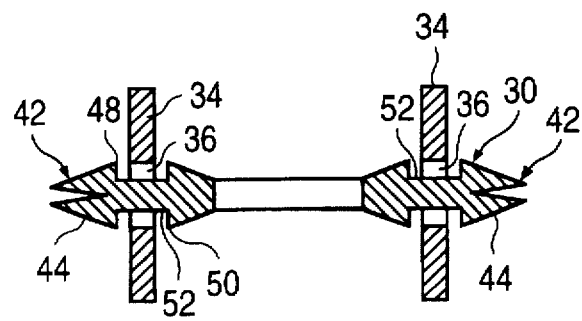
FIG. 4 illustrates an enlarged cross-sectional view of a preferred embodiment of the hinge member and received through the opening in the support member.
Figure 5:
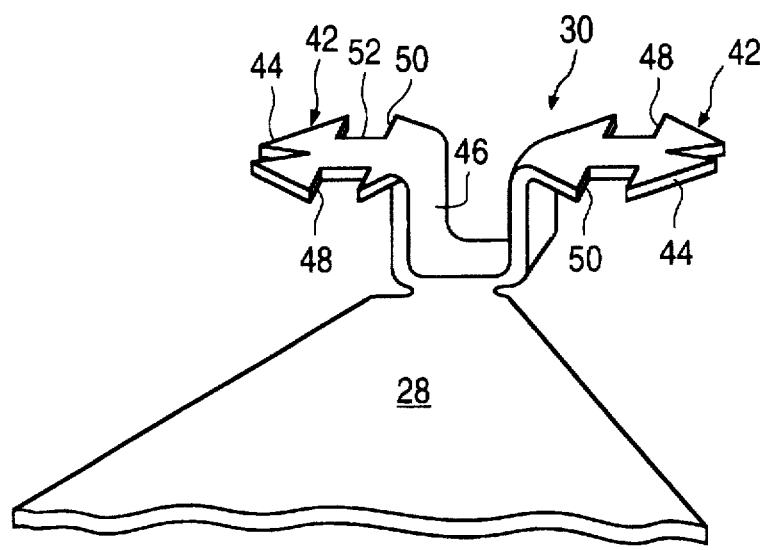
FIG. 5 illustrates an enlarged perspective view of a preferred embodiment of the hinge member associated with a louver member.

Turning now to FIGS. 4 and 5, there is illustrated a preferred embodiment of the hinge member 30 that hingedly attaches the louver member 28 to the support member 20. The hinge member 30 may be integrally formed with the louver member 28, particularly where the louver member 28 is comprised of a plastic material as previously stated. Preferably, the hinge member 30 is comprised of opposing snap members 42 wherein the snap members 42 have a generally flexible, bifurcated insertion end portion 44 configured to be received through openings 36 formed in the hinge supports 34. This configuration allows the louver members 28 to be easily replaced if necessary. The insertion end portion 44 preferably has a shape similar to that of an arrow that has been bifurcated through the middle as shown in FIGS. 4 and 5. The snap member 42 is preferably comprised of a "U" shaped support having the insertion end portions 44 extending outwardly from opposing sides of the "U" shaped support 46. The insertion end portions 44 include a first stop ledge 48 and a second stop ledge 50 joined by a shaft portion 52 and function to maintain the snap member 42 in a correct operating position with respect to the opposing hinge supports 34. The bifurcation in those embodiments where the louver member 28 is comprised of plastic provides the flexibility required to allow the snap member 42 to be received through the openings 36 formed in the support member 20 (see FIG. 2). While a specific hinge member has just been discussed, it will, of course, be appreciated that various hinge assemblies known to those skilled in the art could be used.

With the present invention having now been described, its operation will be briefly discussed with general reference to FIGS. 1–5. In typical computers systems in which the present invention is particularly applicable, an air flow is created through the chassis 10 by conventional cooling fans 38, such as a biscuit fan. Cooler air is pulled into the chassis 10 from the outside by the cooling fan 38. As the air passes by the electrical components, heat is transferred from the heat generating electrical components to the cooler air. The air is then pulled through the first section 24 and the air flow openings 22 in the support member 20 by the cooling fan 38. The air is then pulled through the cooling fans 38, forcing the louver members 28 to pivot to an open position. The air is then pushed by the cooling fans 38 through the second section 26 and the power supply cages 32, thereby cooling the power supply components. The louver members 28 remain in an open position until such time as the air flow ceases. In those instances where a cooling fan 38 fails, gravity causes the louver members 28 associated with the failed fan to pivot to a closed position, which prevents any back-flow of air into the first section 24 of the chassis 10. As explained above, this closing action allows the remaining operating cooling fans 38 to maintain the operating temperature within acceptable operating parameters.

Because of the orientation of the louver members 28 axis of rotation, the louver members 28 will pivot to a closed position in the event of fan failure regardless of the chassis' 10 operating orientation. For example, if a user decides to stand the chassis 10 on its side edge 12 in a vertical position, the louver members 28 will still function properly. Alternatively, if the user decides to return the chassis 10 to its original horizontal position, i.e. on its bottom edge 18, the louver members 28 will function properly. Thus, regardless of the operating orientation of the chassis 10, the louver members 28 will function to prevent back-flow of air into the first section 24 of the chassis 10 when a fan failure occurs. Thus, these features not only provide the user with a more flexible chassis 10 with regard to space utilization, they also reduces manufacturing costs because the manufacture does not have to build separate support members 20 based upon a predetermined operating position.

From the above description, it is apparent that the present invention provides a cooling fan systems for a chassis configured to contain heat generating electrical components and to assume a horizontal and vertical alternative operating orientations. In a preferred embodiment, the cooling fan system comprises a support member securable within the chassis and having an air flow opening formed therein. Additionally, the cooling fan system comprises a louver member hingedly attached to the support member to rotate between an open position wherein a substantial air flow is allowed through the air flow opening and a closed position wherein the louver member covers the air flow opening. Preferably, the louver member is comprised of plastic, however, other types of rigid materials that can withstanding the chassis' operating conditions could also be used, such as metal. The axis of rotation of the louver member is oriented with respect to the chassis to allow gravity to urge the louver member toward the closed position when the chassis is positioned in either the horizontal or vertical alternative operating orientations, to thereby prevent a back-flow of air in the chassis.

Although the present invention and its advantages have been described in detail, those skilled in the art should understand that they can make various changes, substitutions and alterations herein without departing from the spirit and scope of the invention in its broadest form.

What is claimed is:

1. In a chassis enclosure having a first pair of substantially parallel opposing vertical sides, a second pair of substantially parallel opposing vertical sides, and a first pair of substantially parallel opposing horizontal sides, and containing heat generating electrical components, a cooling fan system comprising:

a vertically oriented support member secured within said chassis enclosure and defining a plane substantially parallel to one of the first and second pairs of substantially parallel opposing vertical sides, said support member having an air flow opening formed therein; and a louver member hingedly attached to said support member to rotate between an open position wherein a substantial air flow is allowed through said air flow opening and a closed position wherein said louver member covers said air flow opening, an axis of rotation of said louver member oriented within the plane of the support member and between a horizontal direction and a vertical direction to allow gravity to urge said louver member toward said closed position and thereby prevent a back-flow of air in said chassis enclosure, said louver member actuated by gravity to close when either the vertical sides are vertically oriented or the vertical sides are horizontally oriented by orienting the chassis enclosure on its side.

2. The cooling fan system of claim 1 wherein said louver is comprised of a plurality of louvers hingedly attached to said support member, said plurality of louvers partially overlapping to collectively cover said air flow opening.

3. The cooling fan system of claim 2 wherein said plurality of louvers is comprised of three louvers.

4. The cooling fan system of claim 1 further comprising a cooling fan supported within a fan shroud and positioned over said air flow opening, to thereby force a flow of air through said air flow opening when said louver member is in said open position.

5. The cooling fan system of claim 1 wherein said support member has a plurality of said air flow openings formed therein and a plurality of said louver members associated therewith.

6. The cooling fan system of claim 5 further comprising a plurality of cooling fans with each of said plurality of cooling fans positioned over one of a plurality of said air flow openings.

7. The cooling fan system of claim 5 wherein said plurality of air flow openings are positioned in parallel across a length of said support member.

8. The cooling fan system of claim 1 wherein said louver member is comprised of a plastic material.

9. The cooling fan system of claim 1 wherein said support member has opposing hinge supports mounted adjacent to said air flow opening and coaxial with said axis of rotation and said louver member includes hinge members that project from opposite side edges of said louver member.

10. The cooling fan system of claim 9 wherein said hinge members are comprised of opposing snap members, said snap members having a generally flexible, bifurcated insertion end portion to be received through openings formed in said hinge supports.

11. The cooling fan system of claim 1 wherein the plurality of operating orientations includes a horizontal operating orientation and a vertical operating orientation.

12. The cooling fan system of claim 11 wherein the axis of rotation is at a 45° angle with respect to said horizontal direction and said vertical direction.

13. A computer system, comprising:
a chassis enclosure having a first pair of substantially parallel opposing vertical sides, a second pair of substantially parallel opposing vertical sides, and a first pair of substantially parallel opposing horizontal sides, and containing heat generating electrical components, the heat generating components including:
a processor; and
a memory coupled to the processor; and
a cooling fan system including:
a vertically oriented support member secured within said chassis enclosure and defining a plane substantially parallel to one of the first and second pairs of substantially parallel opposing vertical sides, said support member having an air flow opening formed therein; and
a louver member hingedly attached to said support member to rotate between an open position wherein a substantial air flow is allowed through said air flow opening and a closed position wherein said louver member covers said air flow opening, an axis of rotation of said louver member oriented within the plane of the support member and between a horizontal direction and a vertical direction to allow gravity to urge said louver member toward said closed position and thereby prevent a back-flow of air in said chassis enclosure, said louver member actuated by gravity to close when either the vertical sides are vertically oriented or the vertical sides are horizontally oriented by orienting the chassis enclosure on its side.

14. The computer system of claim 13 wherein said louver is comprised of a plurality of louvers hingedly attached to said support member, said plurality of louvers partially overlapping to collectively cover said air flow opening.

15. The computer system of claim 14 wherein said plurality of louvers is comprised of three louvers.

16. The computer system of claim 13 further comprising a cooling fan supported within a fan shroud and positioned over said air flow opening, to thereby force a flow of air through said air flow opening when said louver member is in said open position.

17. The computer system of claim 13 wherein said support member has a plurality of said air flow openings formed therein and a plurality of said louver members associated therewith.

18. The computer system of claim 17 further comprising a plurality of cooling fans with each of said plurality of cooling fans positioned over one of a plurality of said air flow openings.

19. The cooling fan system of claim 17 wherein said plurality of air flow openings are positioned in parallel across a length of said support member.

20. The computer system of claim 13 wherein said louver member is comprised of a plastic material.

21. The computer system of claim 13 wherein said support member has opposing hinge supports mounted adjacent to said air flow opening and coaxial with said axis of rotation and said louver member includes hinge members that project from opposite side edges of said louver member.

22. The computer system of claim 21 wherein said hinge members are comprised of opposing snap members, said snap members having a generally flexible, bifurcated insertion end portion to be received through openings formed in said hinge supports.

23. The computer system of claim 13 wherein the plurality of operating orientations includes a horizontal operating orientation and a vertical operating orientation.

24. The computer system of claim 23 wherein the axis of rotation is at a 45° angle with respect to said horizontal direction and said vertical direction.

* * * * *

UNITED STATES PATENT AND TRADEMARK OFFICE
CERTIFICATE OF CORRECTION

PATENT NO. : 5,793,610
DATED : August 11, 1998
INVENTOR(S) : Ty Schmitt and David Lyle Moss It is certified that error appears in the above-identified patent and that said Letters Patent is hereby corrected as shown below:

<u>Title page,</u>
Item [63], Related U.S. Application Data, please delete "Jan. 25, 1926", and replace with -- Jan. 25, 1996 --

Signed and Sealed this

Twenty-ninth Day of April, 2003

JAMES E. ROGAN
*Director of the United States Patent and Trademark Office*